United States Patent [19]
Iwamoto et al.

[11] Patent Number: 5,270,977
[45] Date of Patent: Dec. 14, 1993

[54] DYNAMIC RANDOM ACCESS MEMORY DEVICE CAPABLE OF PERFORMING TEST MODE OPERATION AND METHOD OF OPERATING SUCH MEMORY DEVICE

[75] Inventors: Hisashi Iwamoto; Masaki Kumanoya; Katsumi Dosaka; Yasuhiro Konishi; Akira Yamazaki, all of Hyogo, Japan

[73] Assignee: Mitsubishi Denki Kabushiki Kaisha, Tokyo, Japan

[21] Appl. No.: 751,934

[22] Filed: Sep. 3, 1991

[30] Foreign Application Priority Data

Sep. 10, 1990 [JP] Japan .................. 2-240952

[51] Int. Cl.$^5$ .................. G11C 7/00; G11C 29/00
[52] U.S. Cl. .................. 365/201; 365/189.09; 365/226
[58] Field of Search .................. 365/201, 226, 189.09, 365/191; 307/272.3

[56] References Cited

U.S. PATENT DOCUMENTS

| | | | |
|---|---|---|---|
| 4,818,904 | 4/1989 | Kobayashi | 307/594 |
| 4,905,199 | 2/1990 | Miyamoto | 365/226 |
| 4,933,902 | 6/1990 | Yamada et al. | 365/226 |
| 5,073,874 | 12/1991 | Yamada et al. | 365/226 |
| 5,132,937 | 7/1992 | Tuda et al. | 365/201 |

FOREIGN PATENT DOCUMENTS

4041408A1 12/1990 Fed. Rep. of Germany .
3-52326 3/1991 Japan .

Primary Examiner—Eugene R. LaRoche
Assistant Examiner—Son Dinh
Attorney, Agent, or Firm—Lowe, Price, LeBlanc & Becker

[57] ABSTRACT

Disclosed is a DRAM including a test mode operation capable of testing whether a plurality of memory cells are defective or not in a short time. The DRAM includes a power-on detection signal generator, a power-on reset signal generator, and a test mode instruction signal generator. The power-on detection signal generator detects application of a power supply voltage and generates a power-on detection signal. The power-on reset signal generator is reset by a power-on reset signal, counts at least once an external $\overline{RAS}$ signal applied after reset and generates a power-on reset signal. The test mode instruction signal generator detects logic states of an internal RAS signal, an internal CAS signal and an internal W signal applied after the power-on reset and generates a test mode instructing signal.

12 Claims, 12 Drawing Sheets

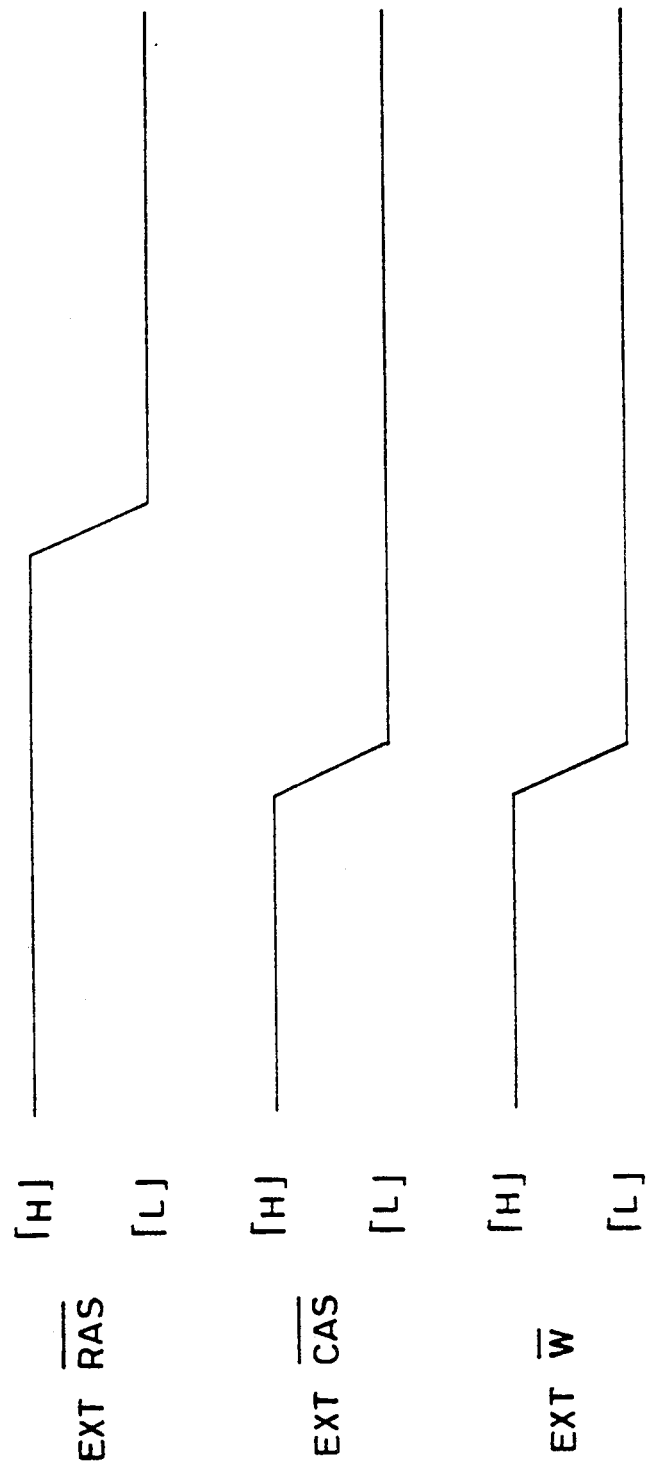

| M0 | M1 | M2 | M3 | OUTPUT Dout |
|---|---|---|---|---|
| 0 | 0 | 0 | 0 | 1 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

DYNAMIC RANDOM ACCESS MEMORY DEVICE CAPABLE OF PERFORMING TEST MODE OPERATION AND METHOD OF OPERATING SUCH MEMORY DEVICE

BACKGROUND OF THE INVENTION

1. Field of the Invention

The present invention relates generally to dynamic random access memory devices including a test mode operation, and more particularly, to a structure and an operating method for ensuring a functional test of such memory devices.

2. Description of the Background Art

Semiconductor memory devices are used in computer or the like, and an increase in the capacity of such semiconductor memory devices has been desired. As a semiconductor memory device of such application, a static random access memory or a dynamic random access memory (hereinafter referred to as DRAM) is employed. In the DRAM, each of memory cells is normally comprised of a single transistor and a single capacitor. This is a so-called one-transistor one-capacitor type memory cell, the cell area of which can be reduced. This memory cell is suitable for a higher integration density of the memory device.

As the integration density and the capacity of the memory device increases as described above, a functional testing time required for selecting defective products of the DRAM increases in proportion to the increasing integration density, leading to a substantial increase in cost for the test. Thus, a semiconductor memory device structured so as to substantially reduce the time required for the functional test has been put into practice. In such a semiconductor memory device, when all information logic values read simultaneously from memory cells of a plurality of bits are identical, a certain logic value is output from the device, thereby simultaneously carrying out the functional test for a plurality of memory devices. (An operation mode in which functional test is carried out simultaneously for the plurality of memory cells is hereinafter referred to as a test mode).

FIG. 4 is a block diagram of a conventional 4-megabit DRAM including the above-described test mode. FIG. 5 is a timing chart of external signals for instructing the test mode.

With reference to FIG. 4, the DRAM includes a memory cell array 20 that is divided into four memory cell array blocks 20a, 20b, 20c and 20d. In the 4-megabit DRAM, each of memory cell array blocks 20a-20d includes memory cells of 1024K bits. In each memory cell array block 20a-20d, the memory cells are arranged in rows and columns, and a word line WL for selecting memory cells of a single row and bit lines BL, $\overline{BL}$ connected with memory cells of a single column are provided. Sense amplifiers 22a-22d for detecting and amplifying information of selected memory cells are provided in memory array blocks 20a-20d, respectively.

The DRAM further includes an RAS buffer 24, a CAS buffer 26, an address buffer 28, row decoders 30a-30d, column decoders 32a-32d, a word driver 34, a sense amplifier controller 36, a nibble decoder 38, a selector gate 40, preamplifiers 42a-42d, a data input buffer 44, a write buffer 46, a logic operation circuit 48, a read gate 50, a data output buffer 52, a POR generator 54, WCBR generator 56, and a test controller 58. RAS buffer 24 receives an externally applied row address strobe signal $\overline{RAS}$ (hereinafter referred to as the external $\overline{RAS}$ signal) and outputs an internal control signal $\overline{RAS}$ (hereinafter referred to as the internal $\overline{RAS}$ signal). Word driver 34 responds to the internal $\overline{RAS}$ signal from RAS buffer 42 to generate a word line driving signal WL. Sense amplifier controller 36 responds to the signal from word driver 34 to generate activating signals SO, $\overline{SO}$ to each of sense amplifiers 22a-22d. CAS buffer 26 receives an externally applied column address strobe signal $\overline{CAS}$ (hereinafter referred to as the external $\overline{CAS}$ signal) and generates an internal control signal $\overline{CAS}$ (hereinafter referred to as the internal $\overline{CAS}$ signal). Address buffer 28 receives externally applied address signals A0-A10 and generates external row address signals RA0-RA10 and internal column address signals CA0-CA10 in a time-divisional multiplexing manner. Each of row decoders 22a-22d decodes applied row address signals RA0-RA9, then selects a corresponding single word line and transmits word line driving signal WL applied from word driver 34 onto the selected word line.

Column decoders 32a-32d receive internal column address signals CA0-CA9 from address buffer 14 and select their corresponding bit line pairs.

Nibble decoder 38 and selector gate 40 are provided to select a one-bit memory cell or select simultaneously or sequentially 4-bit memory cells in accordance with an operation mode from the 4-bit memory cells selected simultaneously in memory cell array blocks 20a-20d. Selector gate 40 includes transfer gate transistors Tr1 and Tr2 for respectively connecting internal data lines DB and $\overline{DB}$ to data input/output lines I/O1 and $\overline{I/O1}$ of memory cell array block 20a, transfer gate transistors Tr3 and Tr4 for respectively connecting internal data lines DB and $\overline{DB}$ to a data input/output line pair I/O2, $\overline{I/O2}$ of memory cell array block 20b, transfer gate transistors Tr5 and Tr6 for respectively connecting internal data lines DB and $\overline{DB}$ to data input/output lines I/O3 and $\overline{I/O3}$ of memory cell array block 20c, and transfer gate transistors Tr7 and Tr8 for respectively connecting data lines DB and $\overline{DB}$ to data input/output lines I/O4 and $\overline{I/O4}$ of memory cell array block 20d.

Nibble decoder 38 receives internal row address signal RA10 and internal column address signal CA10 applied from address buffer 28. In a normal mode, nibble decoder 36 renders only a single set of transfer gate transistors in selector, gate 40 conductive. In a nibble mode, nibble decoder 38 renders sets of transfer gates transistors in selector gate 40 conductive in a sequential cyclical manner from the sets of transfer gate transistors designated by internal address signals RA10 and CA10. Here, the normal mode is an operation mode in which 1-bit data per one memory cycle (during which internal $\overline{RAS}$ signal is in a logic low level) is output in a semiconductor memory device. The nibble mode is an operation mode in which when an external row address and an external column address are applied, a 1-bit memory cell is selected in response to the applied row address and column address, then data of the selected memory cell is written or read, the external $\overline{CAS}$ signal is then toggled while the internal $\overline{RAS}$ signal is kept in a logic low level, and data of subsequent 3-bit memory cells are thereafter sequentially written or read. In the nibble mode, since it is unnecessary to set a row address and a column address for each memory cell, memory cell data can be written/read at a higher speed than in the normal mode for a normal 1-bit pair.

Preamplifiers 42a–42d are connected between selector gate 40 and memory cell array 20 and amplify applied data. Preamplifier 42a is provided corresponding to memory cell array block 20a. Similarly, preamplifiers 42b–42d are provided corresponding to memory cell array blocks 20b–20d.

Data input buffer 44 receives externally applied write data Din, then waveform-shapes the applied data Din and generates, for example, complementary internal write data Din and $\overline{\text{Din}}$. Write buffer 46 responds to a write control signal $\overline{\text{W}}$ (hereinafter referred to as the external $\overline{\text{W}}$ signal) to generate an internal write instruction signal W (hereinafter referred to as the internal W signal). An output of data input buffer 44 is connected with transfer gate transistors Tr10 and Tr9 for transmitting internal write data Din, $\overline{\text{Din}}$ to internal data bus lines DB, $\overline{\text{DB}}$. Data output buffer 50 receives either data on internal data lines DB and $\overline{\text{DB}}$ or an output of logic operation circuit 48 via read gate 50 and outputs the received data or output. Read gate 50 responds to a control signal from test controller 58 to select either a complementary data pair on internal data lines DB and $\overline{\text{DB}}$ or a complementary data pair indicating a logic result from logic operation circuit 48 and apply the selected complementary data pair to output buffer 52. Output buffer 52 responds to the applied complementary data pair to output read data Dout.

Logic operation circuit 48 receives data read via preamplifiers 42a–42d, subjects the received data to a predetermined logic operation and then outputs a logic result comprised of a complementary data pair indicating the result of the logic operation.

POR generator 54 receives a supply voltage Vcc and generates a signal for setting an internal circuit to be power-on after an elapse of a definite time period (hereinafter referred to as the $\overline{\text{POR}}$ signal).

WCBR detector 56 responds to the $\overline{\text{POR}}$ signal from POR generator 54 to detect a logic state of each of the internal $\overline{\text{RAS}}$ signal from RAS buffer 24, the internal $\overline{\text{CAS}}$ signal from $\overline{\text{CAS}}$ buffer 26 and the internal $\overline{\text{W}}$ signal write buffer 46. If the logic states of these signals are a WCBR state in FIG. 5, then WCBR detector 56 generates a test mode instructing signal TE. Here, "WCBR" is the abbreviation of a $\overline{\text{W}}$ and $\overline{\text{CAS}}$ before $\overline{\text{RAS}}$ cycle in which a test mode can be entered by external application of the $\overline{\text{RAS}}$ signal, the $\overline{\text{CAS}}$ signal and the $\overline{\text{W}}$ signal in the state shown in FIG. 5. Designation of the test mode in such a logic state is normalized.

Test controller 58 responds to test mode instructing signal TE from WCBR generator 56 to generate a control signal for switching between a data recording-input mode of a normal 1-bit unit and a test mode. The control signal from test controller 58 is applied to nibble decoder 38 and read gate 50. When supplied with the control signal, nibble decoder 38 renders all transfer gate transistors Tr1–Tr8 in selector gate 40 conductive. Read gate 50 responds to the control signal from test controller 58 to transmit an output of logic operation circuit 48 to output buffer 52.

Description will now be made on an operation of this semiconductor memory device with reference to FIG. 4. The description will first be given on an operation mode in which data of a normal 1-bit unit is input/output.

In the DRAM, a row address and a column address are in general applied to address input terminals (A0–A10 in FIG. 4) in a time-divisional multiplexing manner. The applied row address and column address are accepted at timing of falling edges of a row address strobe signal $\overline{\text{RAS}}$ and a column address strobe signal $\overline{\text{CAS}}$ under control of RAS buffer 24 and CAS buffer 26, respectively, so that internal row address signals RA0–RA10 and internal column address signals CA0–CA10 are generated. Internal row address signals RA0–RA9 of 10 bits out of RA0–RA10 of 11 bits generated by address buffer 28 are applied to row address decoders 30a–30d. Row address decoders 30a–30d decode applied internal row address signals RA0–RA9 and select corresponding word lines. After determination of a word line selecting operation by decoders 30a–30d, word driver 34 generates a word line driving signal WL to transmit the same onto the selected word lines. Accordingly, each of the selected word lines is activated. As a result, information stored in memory cells MC connected to the selected word line is transmitted onto bit line BL (or $\overline{\text{BL}}$). In accordance with the read storage information, a potential on bit line BL (or $\overline{\text{BL}}$) slightly changes, whereas a potential on bit line $\overline{\text{BL}}$ (or BL) in pair therewith does not change. Thus, a potential difference occurs between bit line pair BL, $\overline{\text{BL}}$. Sense amplifiers 22a–22d are activated in response to a sense amplifier activating signal from sense amplifier control circuit 36. The potential difference produced in each bit line pair is amplified. A unit decoder out of column decoders 32a–32d is selected by internal column address signals CA0–CA9. Its corresponding bit line pair BL, $\overline{\text{BL}}$ is connected to data input/output I/O, $\overline{\text{I/O}}$. By a series of operations, in a data reading operation, data of a 1-bit memory cell MC in each of memory cell array blocks 20a–20d is transmitted onto data input/output lines I/O1, $\overline{\text{I/O1}}$ to I/O4, $\overline{\text{I/O4}}$ and then four preamplifiers 42a–42d. Preamplifiers 42a–42d further amplify the applied information.

Most significant address bits RA10 and CA10 of the internal address signal generated by address buffer 28 are applied to nibble decoder 38. Nibble decoder 38 responds to applied most significant internal address signals RA10 and CA10 to select only one of those four outputs and apply the selected signal to selector gate 40. Accordingly, only a set of transfer gate transistors of transistors Tr1–Tr8 included in selector gate 40 are turned on, so that a preamplifier output connected to the turned-on transistor pair is transmitted onto internal data lines DB and $\overline{\text{DB}}$.

In a normal operation mode of units of 2 bits or a fast serial access mode such as a nibble mode, WCBR detector 56 generates no internal test mode instructing signal TE, and test controller 58 controls read gate 50 and connects output buffer 52 to internal data lines DB and $\overline{\text{DB}}$. Accordingly, a complementary data pair transmitted onto internal data lines DB and $\overline{\text{DB}}$ is applied to output buffer 52 and then converted to 1-bit data. After that, the converted data is output as read data Dout from output buffer 52.

In the foregoing data reading operation, write control signal $\overline{\text{W}}$ is in a logic high level, transfer gate transistors Tr9 and Tr10 are rendered nonconductive, and external input buffer 44 is not connected to internal data lines DB and $\overline{\text{DB}}$.

In a data writing operation, external write control signal $\overline{\text{W}}$ attains a logic low level, input buffer 44 is activated, and transfer gate transistors Tr9 and Tr10 are rendered conductive. Accordingly, a complementary input data pair Din, $\overline{\text{Din}}$ corresponding to write data Din generated by input buffer 44 is transmitted onto internal data lines DB and $\overline{\text{DB}}$. The transmitted complementary data pair is transmitted to a selected memory cell via an opposite path to that in the data reading operation. Accordingly, input data is written. The foregoing description is the outline of a data reading or writing operation in the following memory cycle.

In a nibble operation mode, like the normal mode, nibble decoder 38 first responds to internal addresses RA10 and CA10 to select a 1-bit memory cell. Writing or reading of data into/from the selected memory cell is carried out through a preamplifier selected by nibble decoder 38. Subsequently, the external $\overline{CAS}$ signal is sequentially toggled with the external $\overline{RAS}$ signal kept in a logic low level indicating an activation state, whereby nibble decoder 38 responds to the toggling to sequentially turn the sets of transfer gate transistors in selector gate 40 on, so as to sequentially connect preamplifiers 42a–42d to internal data lines DB and $\overline{DB}$. Preamplifiers 42a–42d and memory cell array blocks 20a–20d carry out data transmission simultaneously; however, when viewed from the outside of the memory device, memory cells are accessed sequentially bit by bit from memory cell array blocks 20a–20d, so that data of the accessed memory cells are written or read.

Description will now be given on a test mode operation of the semiconductor memory device. Designation of a test mode is made by externally applying the $\overline{RAS}$ signal, the $\overline{CAS}$ signal and the $\overline{W}$ signal in a logic state shown in FIG. 5. WCBR detector 56 detects the logic states of an internal $\overline{RAS}$ signal, an internal $\overline{CAS}$ signal and an internal $\overline{W}$ signal applied from RAS buffer 24, CAS buffer 26 and write buffer 46 after generation of the $\overline{POR}$ signal and generates an internal test mode instructing signal. That is, if the internal W signal first attains a logic low level, the internal $\overline{CAS}$ signal then attains a logic low level, and finally the internal $\overline{RAS}$ signal attains a logic low level, WCBR detector 56 determines that a test mode instructing signal is externally applied. A normal operation is defined by causing the $\overline{CAS}$ signal to fall after the $\overline{RAS}$ signal attains a logic low level. Further, in order to restore the test mode instruction state to the normal operation, the $\overline{CAS}$ signal and the $\overline{W}$ signal are kept in a logic high level and only the $\overline{RAS}$ signal attains a logic low level, or alternatively, the $\overline{W}$ signal is kept in a logic high level and the $\overline{CAS}$ signal attains a logic low level, and thereafter the $\overline{RAS}$ signal attains a logic low level.

Test controller 58 responds to internal test mode instructing signal TE to control nibble decoder 38 and causes all outputs of nibble decoder 38 to attain a logic high level simultaneously independently of values of internal row address signals RA0–RA10 and internal column address signals CA0–CA10. As a result, all transistors Tr1–Tr8 in selector gate 40 are rendered conductive. In test data writing, data transmitted to selector gate 40 are all transmitted at the same time to a total of 4-bit memory cells selected in memory cell array blocks 20a–20d, so that the same data are written in the 4-bit memory cells. Accordingly, the time required for data writing is reduced to ¼ as compared with a method for making access to memory cells of units of one bit.

In data reading, test controller 58 causes read gate 50 to connect an output of logic operation circuit 48 to output buffer 52. As a result, 4-bit data read from the memory cells are simultaneously transmitted to preamplifiers 42a–42d. The 4-bit memory cell information is transmitted to logic operation circuit 48 and then undergoes a logic operation processing therein. After that, the processed information is applied via read gate 50 to output buffer 52. Output buffer 52 amplifies the output of logic operation circuit 48 and outputs the result of the logic operation. Thus, the time required for data reading is also reduced to ¼ as compared with a method for accessing memory cells in units of one bit for testing.

The structure shown in FIG. 6A is applied to the configuration of logic operation circuit 48, and such structure providing truth values as shown in FIG. 6B is employed. With reference to FIG. 6A, logic operation circuit 48 includes an AND gate AN1 for receiving 4-bit memory cell data M0–M3, an AND gate AN2 for receiving inversion data $\overline{M0}$–$\overline{M3}$ of the 4-bit memory cell data, an OR gate O1 for receiving respective outputs of AND gates AN1 and AN2, and an inverter I1 for inverting an output of OR gate O1. Output buffer 52 includes an N channel MOS transistor Tr1 connected to an operation power source Vcc, and an N channel MOS transistor Tr2 connected to a ground potential. The output of OR gate O1 is applied to a gate of transistor Tr1, and an output of inverter I1 is applied to a gate of transistor Tr2. Read data Dout is output from a node between transistors Tr1 and Tr2.

In the truth table shown in FIG. 6B, the case where a selected memory cell outputs a logic low level is represented by "0", and the case where the selected memory cell outputs a logic high level is represented by "1". As apparent from the truth table of FIG. 6B, when the logic operation circuit shown in FIG. 6A is employed, output data Dout is "1" in the case where all the selected 4-bit memory cells output "0". Similarly, output data Dout is "1" in the case where all the read data are "1". Further, if there is even different read data of one bit, output data Dout attains "0". This system is in general called a binary output system.

FIG. 7 is a circuit diagram of WCBR detector 56. Referring to FIG. 7, WCBR detector 56 includes N channel MOS transistors 5a and 5b, inverters 6a, 6b, 6c and 6d, and an AND gate 7. N channel MOS transistor 5a has its one conduction terminal connected to receive an internal CAS signal, its gate electrode connected to receive an internal $\overline{RAS}$ signal, and the other conduction terminal connected to inverters 6a and 6b. N channel MOS transistor 5b has its one conduction terminal connected to receive an internal $\overline{W}$ signal, its gate electrode connected to receive an internal $\overline{RAS}$ signal and the other conduction terminal connected to inverters 6c and 6d. An input terminal of one of inverters 6a and 6b is connected to an output terminal of the other inverter 6a or 6b. Inverters 6a and 6b maintain outputs from MOS transistor 5a. An input terminal of one of inverters 6c and 6d is connected to an output terminal of the other inverter 6c or 6d. Inverters 6c and 6d maintain outputs of MOS transistor 5b. AND gate 7 has two input terminals and one output terminal, the one input terminal receiving the output held by inverter 6a, the other input terminal receiving the outputs latched by inverters 6c and 6d.

Description will now be given on an operation of WCBR detector 56 shown in FIG. 7. In a normal reading and writing operation of DRAM, externally applied $\overline{RAS}$ signal, $\overline{CAS}$ signal and $\overline{W}$ signal are all in a logic high level the first time. The $\overline{RAS}$ signal is held by RAS buffer 24, the $\overline{CAS}$ signal is held by CAS buffer 26, and the $\overline{W}$ signal is held by write buffer 46. MOS transistors 5a and 5b are rendered conductive in response to an internal $\overline{RAS}$ signal of a logic high level from RAS buffer 24. An internal $\overline{CAS}$ signal of a logic high level from CAS buffer 26 and an internal $\overline{W}$ signal of a logic high level from write buffer 46 are applied as inputs to inverters 6a-6d and held therein. The held logic high level signals are applied to the two input terminals of AND gate 7. As a result, an output of AND gate 7 attains a logic low level. Then, if the internal RAS signal falls, MOS transistors 5a and 5b are rendered nonconductive. Accordingly, the logic high level held in inverters 6a-6d does not change until a subsequent RAS signal attains a logic high level even if the logic levels of the $\overline{CAS}$ signal and the $\overline{W}$ signal change. That is, the $\overline{CAS}$ signal and the $\overline{W}$ signal are latched by the falling of the $\overline{RAS}$ signal. As a result, the output of AND gate 7 is kept at a logic low level. Therefore, in the normal reading and writing operation, since the $\overline{CAS}$ signal falls after the $\overline{RAS}$ signal attains a logic low level, the output of AND gate 7 remains to be in a logic low level.

As to the external test mode signals shown in FIG. 5, also, all the $\overline{RAS}$ signal, $\overline{CAS}$ signal and $\overline{W}$ signal attain a logic high level the first time as in the normal mode, and a logic low level signal is output from AND gate 7. Then, if the $\overline{W}$ signal and the $\overline{CAS}$ signal fall, a logic low level $\overline{CAS}$ signal is input via MOS transistor 5a into inverters 6a and 6b, and a logic low level $\overline{W}$ signal is input via MOS transistor 5b into inverters 6c and 6d. Accordingly, the output of AND gate 7 attains a logic high level.

Thereafter, if the $\overline{RAS}$ signal, $\overline{CAS}$ signal and $\overline{W}$ signal are toggled as in the normal mode in order to write data for testing, then the output of AND gate 7 attains a logic low level. Test controller 58 responds to a temporary signal of a logic high level generated by WCBR detector 56 to start a test mode operation.

In WCBR detector 56 of FIG. 7, however, the rising of the internal $\overline{RAS}$ signal and the internal $\overline{CAS}$ signal becomes unstable immediately after the application of supply voltage Vcc as shown in FIG. 8. Thus, if the $\overline{RAS}$ signal rises prior to the $\overline{CAS}$ signal or the $\overline{W}$ signal, inverters 6a and 6b and inverters 6c and 6d hold the $\overline{CAS}$ signal and the $\overline{W}$ signal both in a logic low level, and hence a logic high level signal is output from AND gate 7. In response to the output signal of a logic high level, test mode controller 58 starts a test mode operation.

Thus, conventionally, setting the DRAM to be power-on after a definite time period has passed since the application of supply voltage Vcc prevents an erroneous starting of the test mode operation.

FIG. 9 is a circuit diagram showing a POR signal generator; and FIG. 10 is a waveform diagram of each circuit of the POR generator immediately after application of a supply voltage. With reference to FIG. 9, POR generator 54 includes a supply voltage terminal 10, a resistor 8 having one end connected to supply voltage terminal 10, a capacitor 9 connected between the other end of resistor 8 and a ground potential, an inverter 11a connected to a connection point (a node N4) between resistor 8 and capacitor 9, and an inverter 11b connected to an output of inverter 11a (a node N 5).

Description will now be made on an operation of POR generator 54. Charges flow from supply voltage terminal 10 via resistor 8 to capacitor 9. The amount of flowing charges is limited by resistor 8, so that a potential on node N4 rises moderately. If the potential on node N4 exceeds a definite level, then an output of inverter 11a rises as shown in node N5 of FIG. 9. Inverter 11b responds to the falling of a potential on node N5 to generate a $\overline{POR}$ signal (a logic high level).

In such a manner, the POR signal can be generated after a definite time period has passed since the application of supply voltage Vcc. WCBR detector 56 shown in FIG. 7 is reset to be power-on by the generated $\overline{POR}$ signal.

Even if the $\overline{POR}$ signal resets the WCBR detector to be, power-on, however, the $\overline{RAS}$ signal, $\overline{CAS}$ signal and $\overline{W}$ signal might be kept in a logic low level as shown in FIG. 11. More specifically, this POR generator serves only to delay the rising of the supply voltage for a definite time period, and hence the rising of the supply voltage is not necessarily coincident with the rising of the internal $\overline{RAS}$ signal, the internal CAS signal and the internal W signal. Therefore, the internal RAS signal might first rise, so that the test mode operation might be started as described above.

SUMMARY OF THE INVENTION

One object of the present invention is therefore to enable a power-on reset after an external status control signal rises, in a dynamic random access memory device including a test mode operation.

Another object of the present invention is to, in a dynamic random access memory device including a test mode operation, prevent erroneous performance of the test mode operation.

Briefly, a dynamic random access memory device according to the present invention includes a memory cell array having a plurality of memory cells for storing information therein. The memory device further includes a test mode operation in which a determination is made as to whether the memory cells included in the memory cell array are defective or not. The test mode operation is regulated by a logic state of an externally applied status control signal for controlling the state of the memory device.

The memory device further includes a status control signal receiving apparatus, a power-on detection signal generating apparatus, a power-on reset apparatus and a test mode instruction signal generating apparatus.

The status control signal receiving apparatus receives an externally applied status control signal.

The power-on detection signal generating apparatus detects external application of a power supply to generate a power-on detection signal.

The power-on reset apparatus responds to the power-on detection signal generated by the power-on detection signal generating apparatus to count the externally applied status control signal by predetermined times and reset the counted signal to be power-on.

The test mode instruction signal generating apparatus detects a logic state of the status control signal received by the status control signal receiving apparatus after the power-on reset and generates a signal for instructing a test mode.

In operation, the power-on reset apparatus responds to the power-on detection signal to count the external status control signal by predetermined times and then reset the memory device to be power-on. Accordingly, the status control signal receiving apparatus is also reset to be power-on, so as to be able to receive an externally applied status control signal after the power-on reset (i.e., the receiving apparatus is made stable). As a result, the logic state of the externally applied status control signal can match that of an internal status control signal. This makes it possible to prevent the test mode instruction signal generating apparatus from generating an internal test mode instruction signal even though an external status control signal designates a normal operation mode.

According to another aspect of the present invention, the power-on reset apparatus counts by predetermined times a status control signal of a predetermined cycle internally applied as a setup signal after application of a supply voltage, and then resets the memory device to be power-on.

Accordingly, the status control signal receiving apparatus can receive a status control signal provided after the application of the setup signal. Also, the test mode instruction signal generating apparatus can accurately determine whether a normal mode or a test mode operation is designated, on the basis of a logic state of an internal status control signal from the status control signal receiving apparatus.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a waveform diagram of an external signal for designating a test mode.

DESCRIPTION OF THE PREFERRED EMBODIMENTS

Figure 1A:
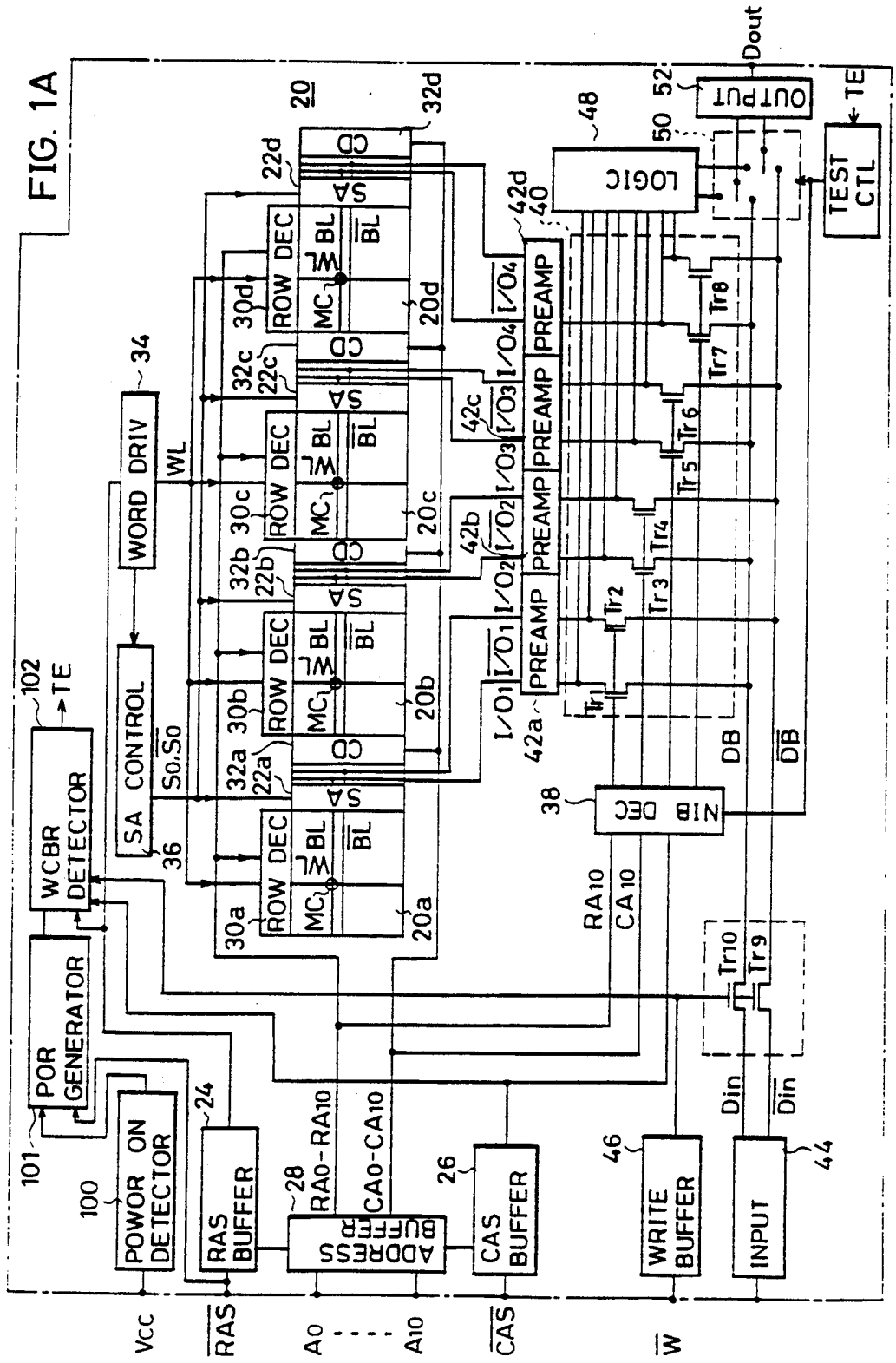
FIG. 1A is a block diagram showing one embodiment of a DRAM of the present invention.
Figure 4:
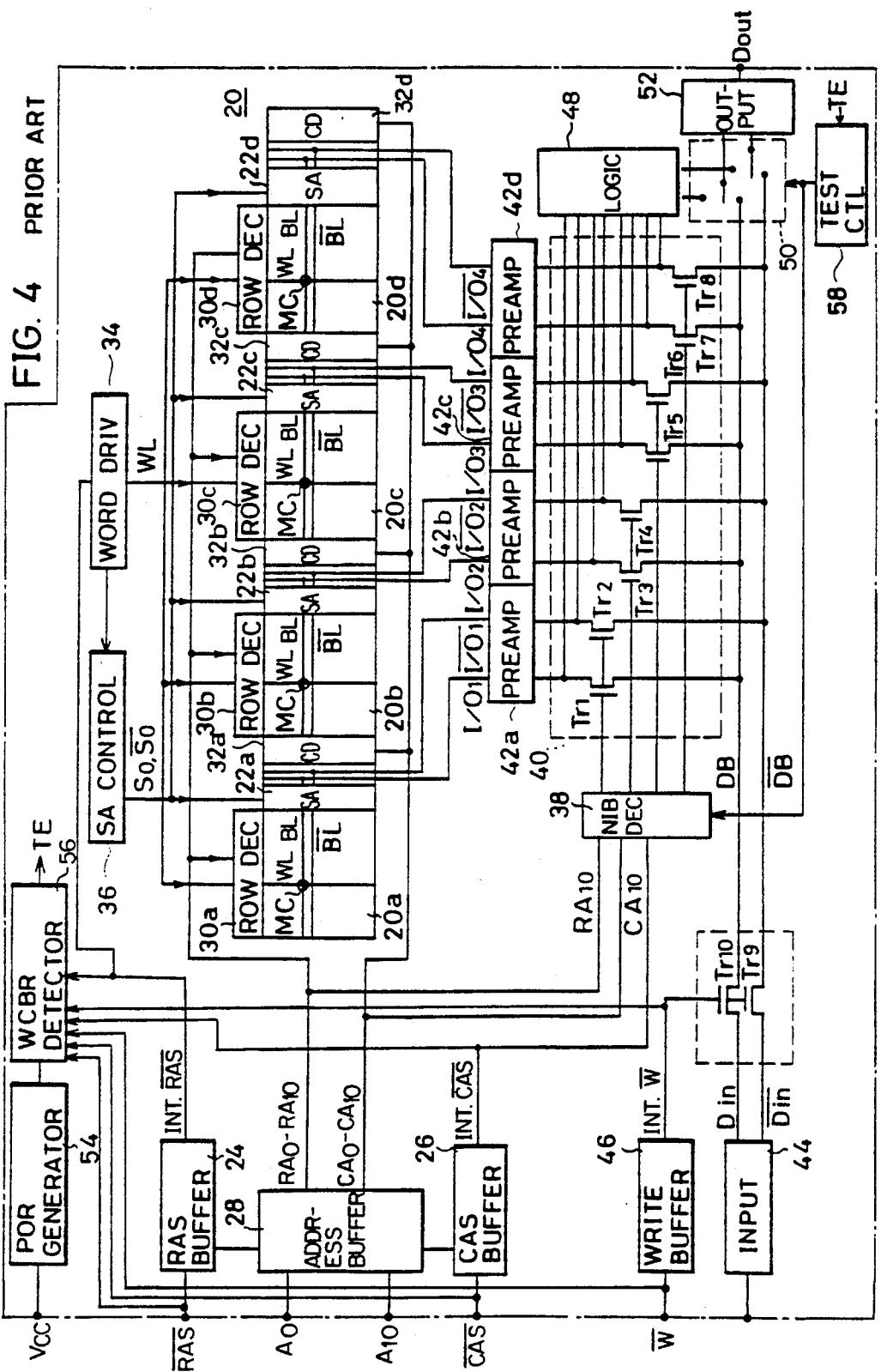
FIG. 4 is a block diagram of a conventional DRAM including a test mode operation.
Figures 6A, 6B:
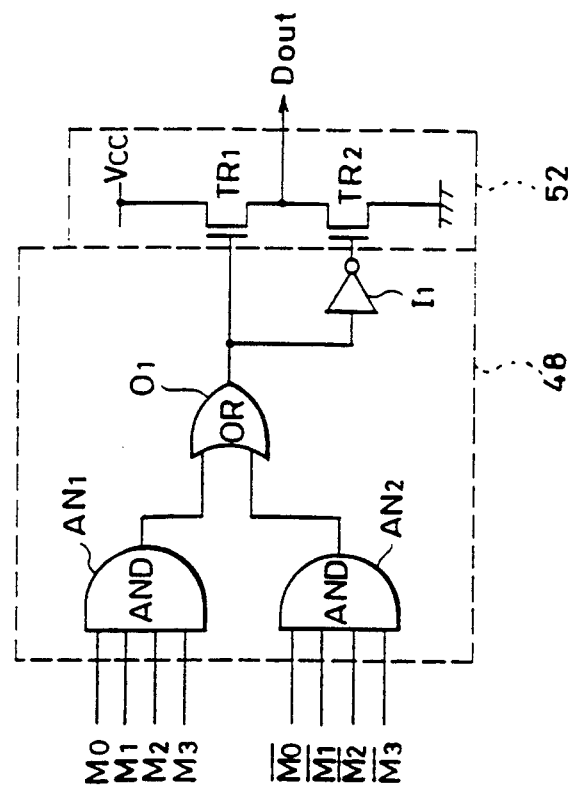
FIG. 6A is a circuit diagram of a logic operation circuit of FIG. 4.
FIG. 6B is a truth table of the logic operation circuit of FIG. 6A.

FIG. 1A is a block diagram showing one embodiment of a DRAM of the present invention. Referring to FIG. 1A this DRAM is different from the one shown in FIG. 4 in that a power-on detection signal generator 100 that detects application of a power supply voltage Vcc, a POR generator 101 that counts once an external RAS signal of a dummy cycle period and generates a POR signal, a WCBR detector 102 that responds to the POR signal from the POR generator to be power-on reset, so as to detect logic states of subsequently applied internal RAS signal, internal CAS signal and internal W signal are provided in place of the POR generator that delays the rising of a power supply voltage to generate a POR signal. The other circuits are of the same configurations as those of the circuits in the DRAM of FIG. 4. Thus, like reference characters denote like circuit components, and a description thereof will not be repeated if unnecessary.

In general, the dummy cycle period is provided to control or regulate a setup time period provided before entry into operation. In this time period, an external $\overline{RAS}$ signal is toggled eight times, so that an external $\overline{W}$ signal is maintained at a logic high level. Further, the external $\overline{RAS}$ signal and external $\overline{CAS}$ signal may be toggled eight times to maintain the external $\overline{W}$ signal at a logic high level.

Power-on detection signal generator 100 detects that power supply voltage Vcc rises at a definite level.

POR signal generator 101 is connected between an output of power-on detector 100 and an RAS terminal for receiving an external RAS signal and counts once an RAS signal of a dummy cycle period applied through the external $\overline{RAS}$ terminal after application of a power-on detection signal, so as to generate a $\overline{POR}$ signal.

Figure 1B:
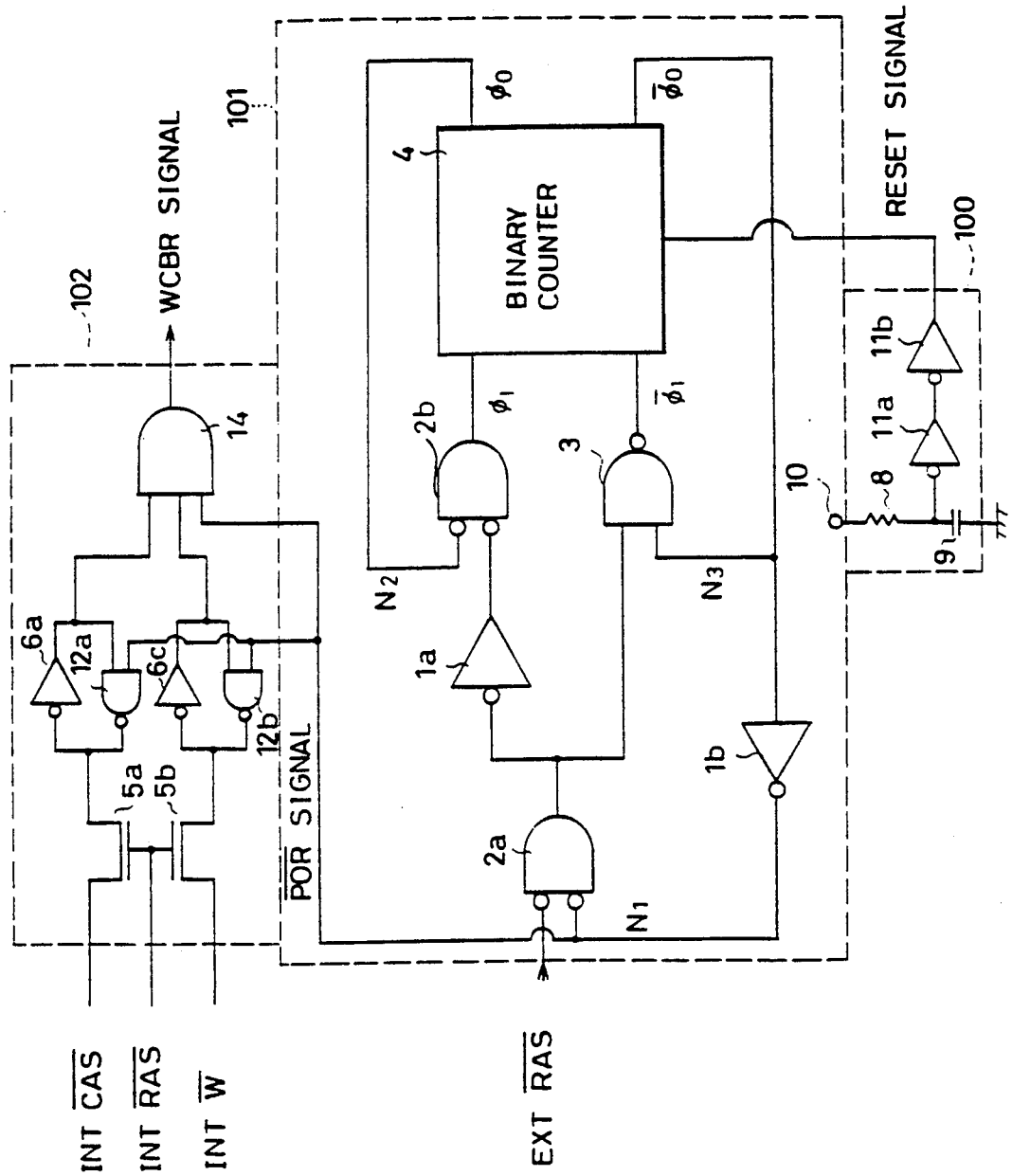
FIG. 1B is a circuit diagram of a power-on detection signal generator, a POR generator and a WCBR detector of FIG. 1A.
Figure 9:
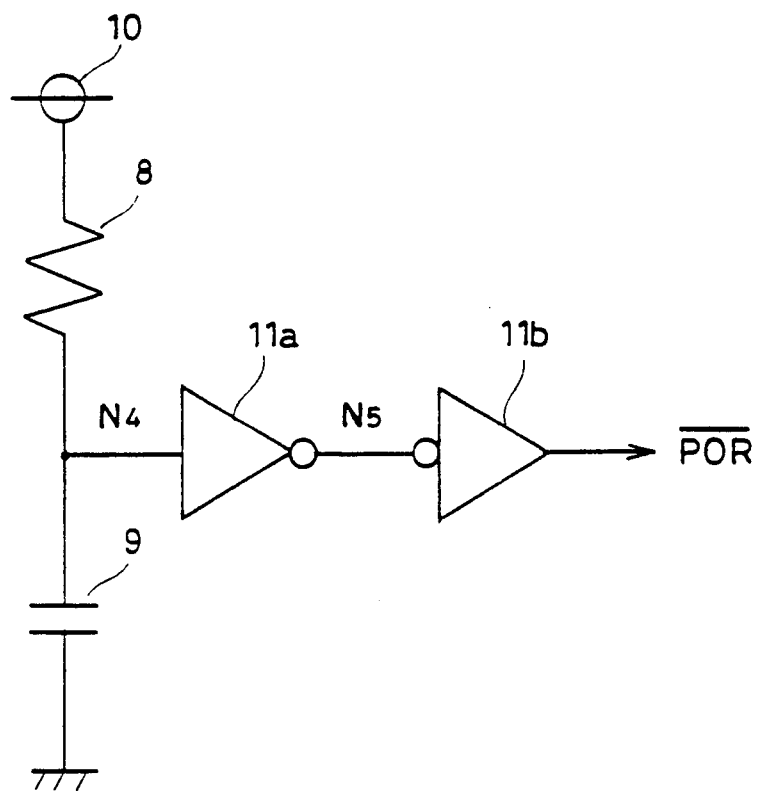
FIG. 9 is a circuit diagram of a POR generator of FIG. 7.
Figure 10:
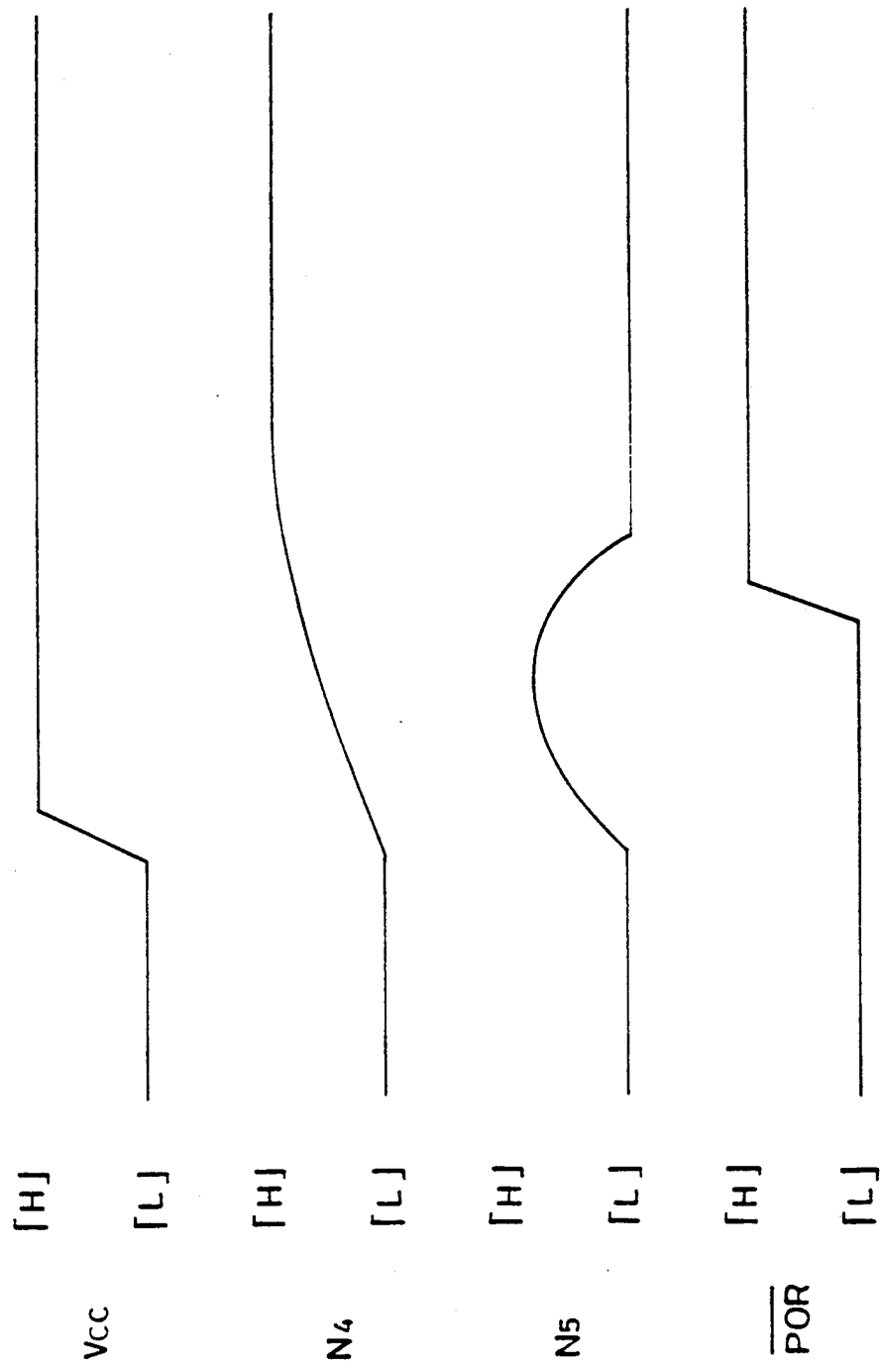
FIG. 10 is a signal waveform diagram of respective circuits of the POR generator of FIG. 9.
Figure 11:
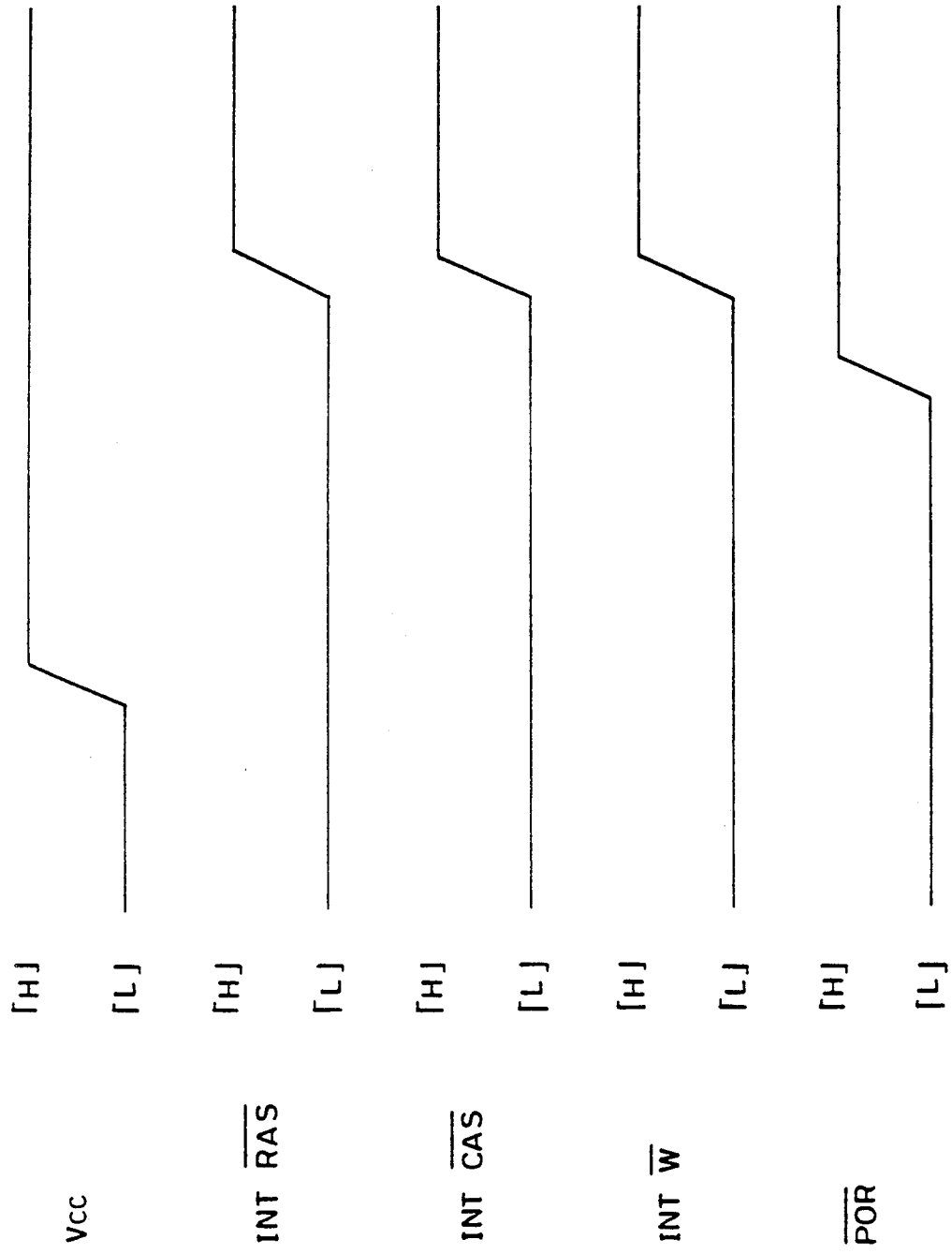
FIG. 11 is a diagram of signal waveforms that might enter in the test mode operation even if a POR signal is generated.

FIG. 1B is a circuit diagram of the power-on detection signal generator, the POR signal generator and the WCBR detector of FIG. 1A. Referring to FIG. 1B, power-on detector 100 is of the same configuration as that of POR generator of FIG. 9. This is because power-on detection signal generator 100 is the same as the POR generator of FIG. 9 in that it detects the rising of power supply voltage Vcc at a definite level. However, delay time of detector 100 can be shortened as compared to that of the POR generator of FIG. 9, and the impedance of resistor 8 and capacitor 9 may be decreased.

Figure 3:
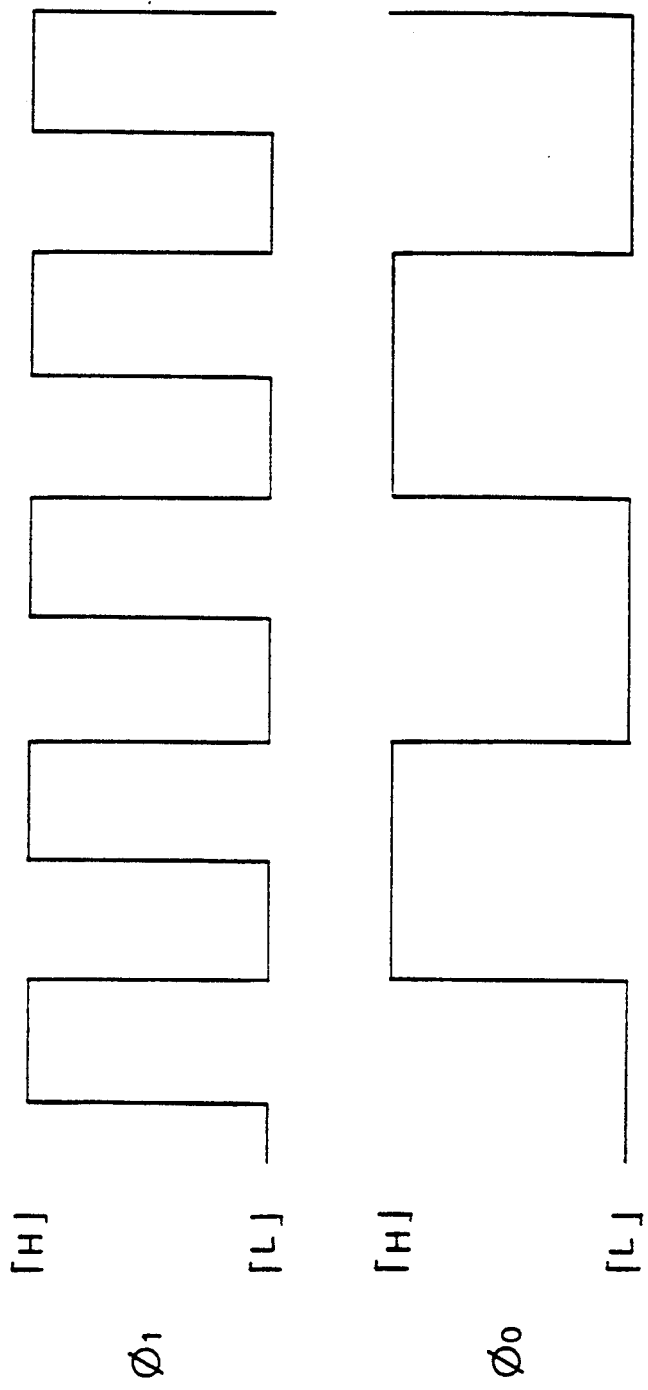
FIG. 3 is a signal waveform diagram showing an operation of a binary counter.

POR generator 101 includes inverters 1a and 1b, NOR gates 2a and 2b each having two input terminals and one output terminal, an NAND gate 3 having two input terminals and one output terminal, and a binary counter 4 having two input terminals $\phi 1$ and $\overline{\phi 1}$, two output terminals $\phi 0$ and $\overline{\phi 0}$ and one reset terminal. NOR gate 2a has its one input terminal connected to receive an external $\overline{RAS}$ signal, the other input terminal connected to an output of inverter 1b and its output terminal connected to an input of inverter 1a and one input terminal of NAND gate 3. NOR gate 2b has its one input terminal connected to an output of inverter 1a, the other input terminal connected to output terminal $\phi 0$ of binary counter 4 and its output terminal connected to input terminal $\phi 1$ of binary counter 4. NAND gate 3 has the other input terminal connected to output terminal $\overline{\phi 0}$ of binary counter 4 and its output terminal connected to input terminal $\overline{\phi 1}$ of binary counter 4. Inverter 1b is connected to output terminal $\overline{\phi 0}$ binary counter 4. In the following description, the input terminals of binary counter 4 and signals applied thereto are denoted with the same reference characters. Similarly, the output terminals of binary counter 4 and signals output therefrom are denoted with the same reference characters. Binary counter 4 counts a signal $\phi 1$ output from NOR gate 2b and a signal $\overline{\phi 1}$ from NAND gate 3 and outputs a pulse signal for each one cycle of the signals. That is, binary counter 4 carries out a counting operation as shown in FIG. 3. More specifically, binary counter 4 outputs an output signal $\phi 0$ once every time input signal $\phi 1$ is applied twice. Binary counter 4 is provided with a power-on detection signal through its reset terminal from power on detector 100. In response to the applied power-on detection signal, output signal $\overline{\phi 0}$ attains a logic high level, and output signal $\phi 0$ attains a logic low level.

Figure 2:
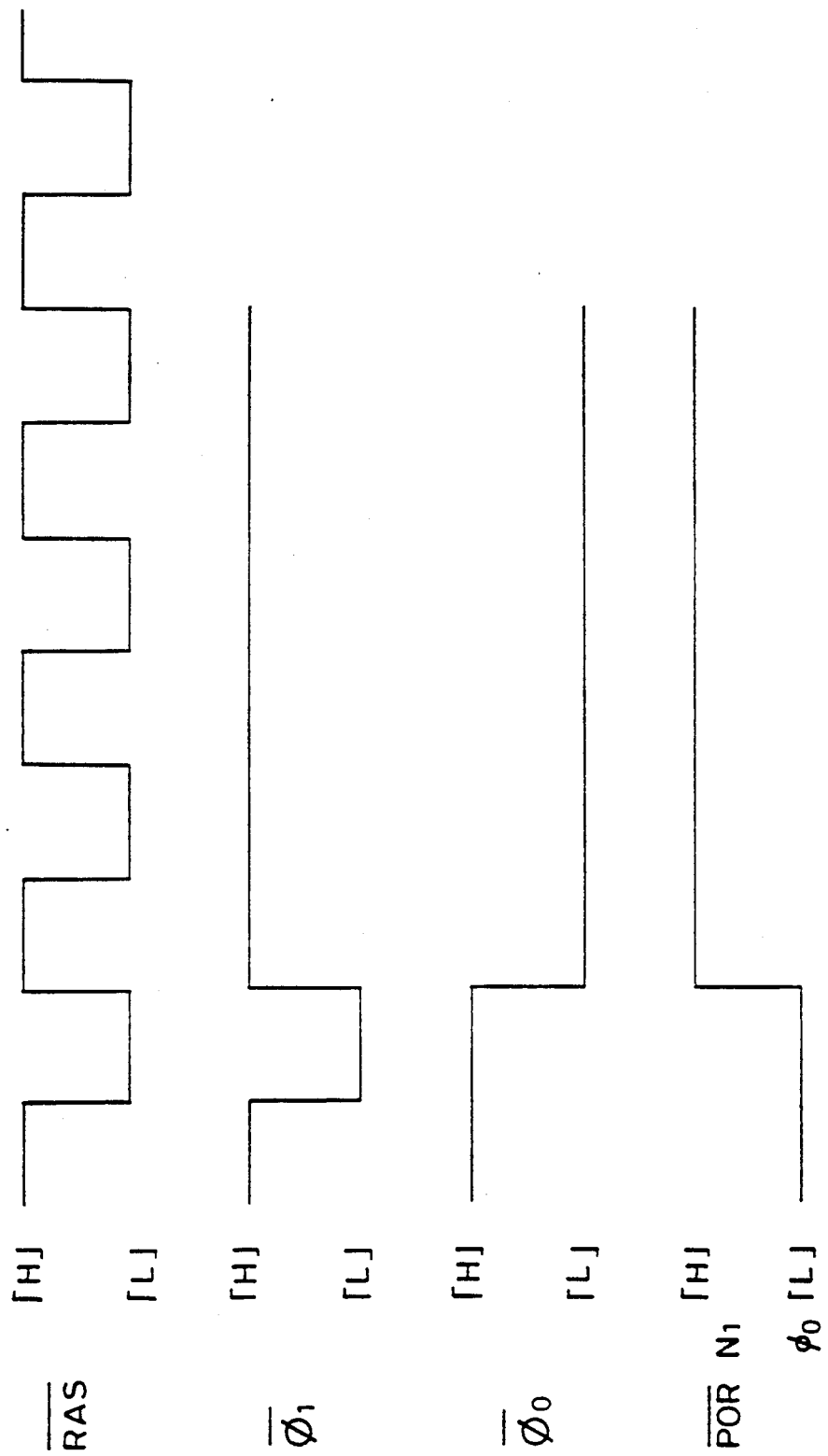
FIG. 2 is a signal waveform diagram of respective circuits of the POR generator.
Figure 7:
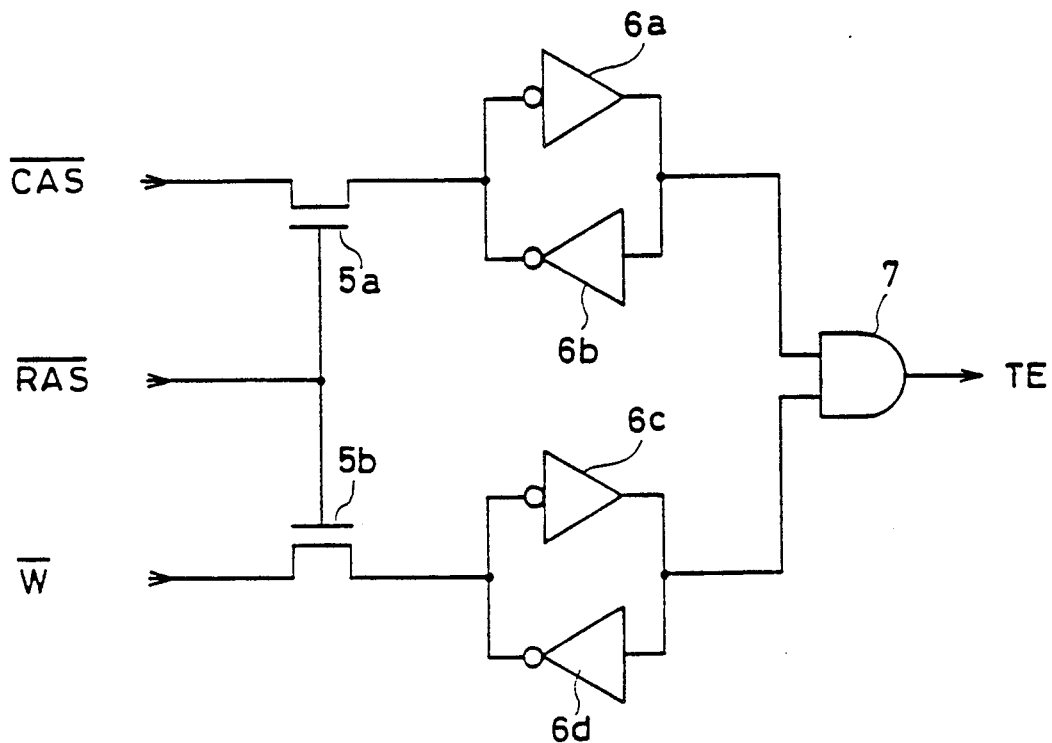
FIG. 7 is a circuit diagram of a WCBR detector of FIG. 4.
Figure 8:
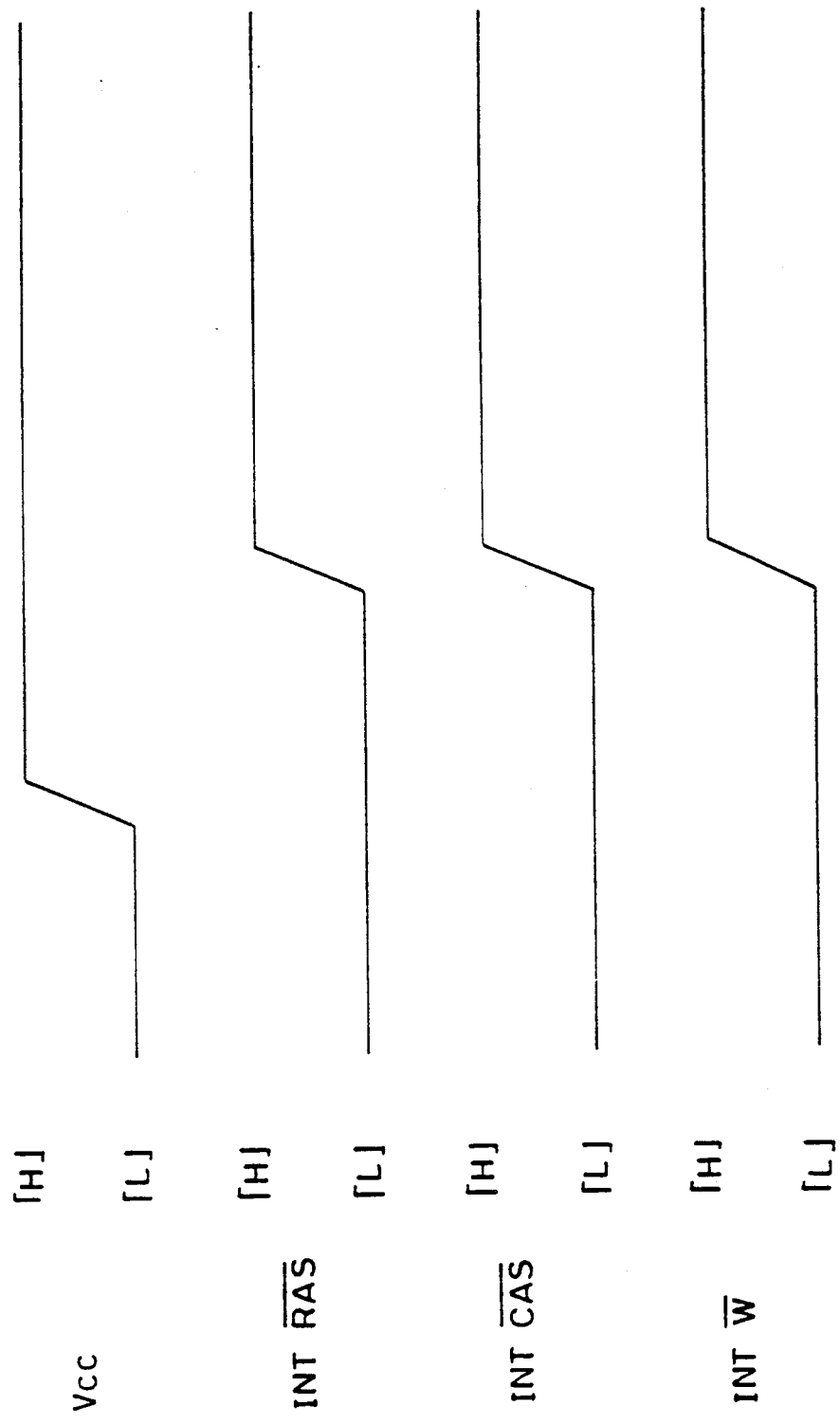
FIG. 8 is a diagram of signal waveforms that might enter in a test mode operation.

In WCBR detector 102, NAND gates 12a and 12b are employed in place of inverters 6b and 6d in the WCBR detector of FIG. 7, and a 3-input AND gate 14 is employed in place of the 2-input AND gate of FIG. 7. NAND gate 12a has its one input terminal connected to an output of inverter 6a and the other input terminal connected to the output of inverter 1b in POR generator 101. NAND gate 12b has its one input terminal connected to an output of inverter 6c and the other input terminal connected to the output of inverter 1b. AND gate 14 has one input terminal connected to the output of inverter 1b. That is, WCBR detector 102 is structured to be reset by POR generator 101. FIG. 2 is a signal waveform diagram of respective circuits of POR generator 101. The operation of the circuit of FIG. 1B will now be described with reference to FIGS. 1B and 2. Power-on detector 100 detects application of power supply voltage Vcc to generate a $\overline{POR}$ signal and apply the same to the reset terminal of binary counter 4. Binary counter 4 is reset by a power-on detection signal, so that output signals $\overline{\phi 0}$ and $\phi 0$ attain a logic high level and a logic low level, respectively. Output signal $\overline{\phi 0}$ is applied to inverter 1b and NAND gate 3. Inverter 1b inverts output signal $\overline{\phi 0}$ and outputs a $\overline{POR}$ signal of a logic low level. The $\overline{POR}$ signal is applied to the other input terminal of NOR gate 2a. Output signal $\phi 0$ is applied to the other input terminal of NOR gate 2b. Output signal $\overline{\phi 0}$ of a logic high level is applied to the other input terminal of NAND gate 3.

Then, a dummy cycle starts, so that an external $\overline{RAS}$ signal is cyclically applied. The other input terminal of each of NOR gates 2a and 2b is at a logic low level after reset, and the other input terminal of NAND gate 3 is at a logic high level after reset. Therefore, when the external $\overline{RAS}$ signal is at a logic high level, input signal $\phi 1$ to binary counter 4 attains a logic low level. When the external $\overline{RAS}$ signal is at a logic low level, input signal $\phi 1$ to binary counter 4 attains a logic high level. Accordingly, binary counter 4 is provided with an input signal in the cycle of the external $\overline{RAS}$ signal. If the external $\overline{RAS}$ signal makes two cycles, the input signal to binary counter 4 also makes two cycles, so that output signals $\overline{\phi 0}$ and $\phi 0$ of binary counter 4 attain a logic low level and a logic high level, respectively. If the output of binary counter 4 is inverted, then the POR signal is also inverted to attain a logic high level, and the other input signal of NOR gate 2a also changes to a logic high level. The other input signal of NOR gate 2b attains a logic high level and the other input signal of NAND gate 3 attains a logic low level. If the other input signal of NOR gate 2a attains a logic high level, then NOR gate 2a outputs a signal of a logic low level even if the external $\overline{RAS}$ signal is at either a logic low level or a logic high level. Further, if the other input signal of NOR gate 2b attains a logic high level and the other input signal of NAND gate 3 attains a logic low level, NOR gate 2b outputs a signal of a logic low level and NAND gate 3 outputs a signal of a logic high level even if the output of NOR gate 2a is at either a logic low level or a logic high level. Accordingly, the output signals of binary counter 4 are inverted: output signal $\overline{\phi 0}$ attains a logic low level, and output signal $\phi 0$ attains a logic high level. Even if the external $\overline{RAS}$ signal is thereafter applied cyclically, the POR signal does not change. That is, the POR signal rises from a logic low level to a logic high level in response to the external $\overline{RAS}$ signal of the dummy cycle period. After that, the POR signal maintains a logic high level as far as it is not reset.

According to the above-described embodiment, the power-on reset can be made after the external $\overline{RAS}$ signal of the dummy cycle period is counted. Accordingly, since WCBR detector 100 generates a test mode instructing signal after the internal $\overline{RAS}$ signal, the internal $\overline{CAS}$ signal and the internal $\overline{W}$ signal rise, detector 100 can be prevented from generating a test mode signal despite a normal mode.

While the $\overline{POR}$ signal is raised when the external $\overline{RAS}$ signal makes two cycles by using the binary counter in the embodiment of FIG. 1B, the same effect can be obtained even if the binary counter is replaced by an octal counter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device including a memory cell array having a plurality of memory cells storing information therein, said memory device including a test mode operation for determining whether the memory cells included in said memory cell array are defective or not, said test mode operation being regulated by a logic state of an externally applied status control signal for controlling the state of said memory device, said memory device comprising:
    means for receiving said externally applied status control signal;
    means for detecting external application of a power supply to generate a power-on detection signal;
    means responsive to said generated power-on detection signal for counting logic state changes of said externally applied status control signal and providing power-on reset after a predetermined number of logic state changes; and
    means for detecting the logic state of said received status control signal after said power-on reset, to generate a signal for designating a test mode.

2. The dynamic random access memory device according to claim 1, wherein
    said power-on detection signal generating means includes delay means for delaying a rising of a power supply voltage for a definite time period, and a plurality of coupled inverter means for receiving the delayed power supply voltage.

3. The dynamic random access memory device according to claim 1, wherein
    said status control signal includes a row address strobe signal, a column address strobe signal, and a write control signal for controlling a writing into said memory device; and
    said test mode operation is regulated by logic states of said row address strobe signal, said column address strobe signal and said write control signal.

4. The dynamic random access memory device according to claim 3, wherein
    said row address strobe signal is applied by a plurality of cycles for setup immediately after a power supply is turned on, and said write control signal is rendered nonactive in a setup time period; and said power-on reset means counts said row address strobe signal of the setup time period by predetermined times and resets the memory devices to be power-on.

5. A dynamic random access memory device including a memory cell array having a plurality of memory cells storing information therein, said memory device including a test mode operation for determining whether the memory cells included in said memory cell array are defective or not, said test mode operation being regulated by a logic state of an externally applied status control signal for controlling the state of said memory device, said memory device comprising:
means for receiving said externally applied status control signal;
means for detecting external application of a power supply to generate a power-on detection signal;
means responsive to said generated power-on detection signal for counting logic state changes of said externally applied status control signal and providing power-on reset after a predetermined number of logic state changes; and
means for detecting the logic state of said received status control signal after said power-on reset, to generate a signal for designating a test mode, wherein
said status control signal includes a row address strobe signal, a column address strobe signal, and a write control signal for controlling a writing into said memory device;
said test mode operation is regulated by logic states of said row address strobe signal, said column address strobe signal and said write control signal,
said power-on reset means includes counting means and signal applying means operatively coupled to said counting means for applying said received row address strobe signal to said counting means after the power supply is turned on.

6. The dynamic random access memory device according to claim 5, wherein
said counting means reset by said power-on detection signal for counting the row address strobe signal from said signal applying means after reset; and
said signal applying means includes means responsive to the pulse signal output from said counting means for stopping the application of said row address strobe signal to said counting means.

7. The dynamic random access memory device according to claim 6, wherein
said means for stopping the application of said row address strobe signal includes logic operation means for subjecting the pulse signal from said counting means and the row address strobe signal to a logic operation, so as to obtain a signal of a definite level.

8. The dynamic random access memory device according to claim 5, wherein
said counting means includes a binary counter having two input terminals and two output terminals, said binary counter being reset by said power-on detection signal for generating complementary signals from said two output terminals and thereafter counting the row address strobe signal from said signal applying means at least once, to generate an output pulse signal; and
said signal applying means includes:

logical NOR means for applying a result of NORing a signal from the one output terminal of said binary counter and the row address strobe signal received by said status control signal receiving means to the one input terminal of said binary counter, and
logical NAND means for applying a result of NANDing a signal from the other output terminal of said binary counter and the row address strobe signal received by said status control signal receiving means to the other input terminal of said binary counter.

9. A dynamic random access memory device including a memory cell array having a plurality of memory cells storing information therein, said memory device including a test mode operation for determining whether the memory cells included in said memory cell array are defective or not, said test mode operation being regulated by a logic state of an externally applied status control signal for controlling the state of said memory device, said memory device comprising:
means for receiving said externally applied status control signal;
means for detecting external application of a power supply to generate a power-on detection signal;
means responsive to said generated power-on detection signal for counting logic state changes of said externally applied status control signal and providing power-on reset after a predetermined number of logic state changes; and
means for detecting the logic state of said received status control signal after said power-on reset, to generate a signal for designating a test mode, wherein
said status control signal includes a row address strobe signal, a column address strobe signal, and a write control signal for controlling a writing into said memory device;
said test mode operation is regulated by logic states of said row address strobe signal, said column address strobe signal and said write control signal,
said row address strobe signal is applied by a plurality of cycles for setup immediately after a power supply is turned on, and said write control signal is rendered nonactive in a setup time period;
said power-on reset means counts said row address strobe signal of the setup time period by predetermined times and resets the memory devices to be power-on,
said test mode instruction signal generating means includes: means for detecting the order of status changes of the row address strobe signal, the column address strobe signal and the write control signal received by said status control signal receiving means, and
means responsive to at least a second rising of said row address strobe signal applied after application of a power supply voltage for activating said means for detecting the order of the status changes.

10. The dynamic random access memory device according to claim 9, wherein
said means for detecting the order of said status changes includes means responsive to the row address strobe signal received by said status control signal receiving means for latching said received column address strobe signal and said received write control signal.

11. A dynamic random access memory device including a memory cell array having a plurality of memory cells storing information therein, said memory device including a test mode operation for simultaneously selecting a predetermined number of memory cells of a plurality of bits in said memory cell array, then simultaneously reading the information stored in said predetermined number of selected memory cells, and determining whether said memory device is defective or not in accordance with the read information, said test mode operation being regulated by an externally applied status control signal for controlling the state of said memory device, said memory device comprising:
means for receiving said status control signal;
means for detecting that a power supply is externally turned on, to generate a power-on detecting signal;
means responsive to said generated power-on detection signal for counting logic state changes of said status control signal to generate a power-on reset signal after a predetermined number of logic state changes;
means for detecting a logic state of a status control signal received after said power-on reset, to generate a signal for instructing a test mode;
means activated in response to said test mode instructing signal and responsive to an externally applied address for simultaneously selecting said predetermined number of memory cells from said memory cell array;
means for receiving externally applied write data;
means differentially coupled to said means for receiving said write data, for writing said write data into said predetermined number of selected memory cells;
means for making access to said predetermined number of selected memory cells, to read data from said data-written memory cells; and
means activated in response to said test mode instructing signal, for receiving output data from said reading means to output a logic value corresponding to the received data.

12. A method of operating a dynamic random access memory device including a memory cell array having a plurality of memory cells storing information therein, said memory device including a test mode operation for determining whether the memory cells includes in said memory cell array are defective or not, said test mode operation being regulated by a logic state of an externally applied status control signal for controlling the state of said memory device, said operating method comprising the steps of:
receiving the externally applied status control signal;
detecting that a power supply is externally turned on, to generate a power-on detection signal;
responsive to said generated power-on detection signal counting logic state changes of said externally applied status control signal to reset the memory device to be power-on after a predetermined number of logic state changes; and
detecting the logic state of said received status control signal after said power-on reset, to generate a signal for instructing a test mode.

* * * * *